(12) United States Patent
Geary et al.

(10) Patent No.: US 9,209,809 B1
(45) Date of Patent: Dec. 8, 2015

(54) CIRCUITS FOR AND METHODS OF CONTROLLING OUTPUT SWING IN A CURRENT-MODE LOGIC CIRCUIT

(71) Applicant: Xilinx, Inc., San Jose, CA (US)

(72) Inventors: Kevin Geary, Ballincollig (IE); Ronan Casey, Cork (IE); Declan Carey, Douglas (IE); Thomas Mallard, Popes Quay (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/573,815

(22) Filed: Dec. 17, 2014

(51) Int. Cl.
*H03K 19/094* (2006.01)
*H03K 19/0185* (2006.01)
*H03K 19/003* (2006.01)

(52) U.S. Cl.
CPC .. *H03K 19/018514* (2013.01); *H03K 19/00384* (2013.01)

(58) Field of Classification Search
CPC .................... H03K 19/09432; H03K 19/01728
USPC ............... 326/82–83, 112, 115; 327/108–109
See application file for complete search history.

(56) References Cited

U.S. PATENT DOCUMENTS

| | | | |
|---|---|---|---|
| 6,437,599 B1 | 8/2002 | Groen | |
| 7,362,138 B1 * | 4/2008 | Arsovski et al. | 326/83 |
| 7,397,283 B2 * | 7/2008 | Chiu et al. | 326/83 |
| 8,134,418 B2 | 3/2012 | Jiang | |
| 2013/0249612 A1 * | 9/2013 | Zerbe et al. | 327/161 |

OTHER PUBLICATIONS

Ramzan, R. et. al., "On-chip Calibration of RF Detectors by DC Stimuli and Artificial Neural Networks", IEEE Radio Frequency Integrated Circuits Symposium (RFIC) 2008, Jun. 15-17, 2008, pp. 1-4, Atlanta, Georgia, USA.
Sleiman, S.B., et. al., "A CMOS Amplitude Detector for RF-BIST and Calibration", 16$^{th}$ IEEE International Conference on Electronics, Circuits, and Systems, ICECS 2009, Dec. 13-16, 2009, pp. 807-810.
Wang, Q., et. al., "RF Front-end System Gain and Linearity Built—in Test", Proceedings of the 24th IEEE VLSI Test Symposium, (VTS'06), Apr. 30-May 4, 2006, pp. 1-6, Berkeley, CA USA.

* cited by examiner

*Primary Examiner* — Jason M Crawford
(74) *Attorney, Agent, or Firm* — John J. King

(57) ABSTRACT

A circuit for controlling output swing in a current-mode logic circuit is described. The circuit comprises a plurality of current-mode logic circuits coupled in series; a first current-mode logic circuit of the plurality of current-mode logic circuits coupled to provide a signal to a second current-mode logic circuit of the plurality of current-mode logic circuits; an amplitude detector coupled to detect an amplitude of the signal received at the second current-mode logic circuit; and a control circuit coupled to the amplitude detector; wherein the control circuit generates an amplitude control signal for a current-mode logic circuit of the plurality of current-mode logic circuits based upon a detected amplitude of the signal received at the second current-mode logic circuit. A method of controlling output swing in a current-mode logic circuit is also disclosed.

20 Claims, 11 Drawing Sheets

US 9,209,809 B1

CIRCUITS FOR AND METHODS OF CONTROLLING OUTPUT SWING IN A CURRENT-MODE LOGIC CIRCUIT

FIELD OF THE INVENTION

The present invention relates generally to integrated circuit devices, and in particular, to circuits for and methods of controlling output swing in a current-mode logic circuit.

BACKGROUND OF THE INVENTION

Clock transmission in an integrated circuit and systems implementing an integrated circuit is an important aspect of implementing the integrated circuit, such as a programmable logic device (PLD) or an application specific integrated circuit (ASIC). Accurate clock transmission not only affects the functionality of an integrated circuit or system, but also the speed of the integrated circuit or system.

Complementary metal oxide semiconductor (CMOS) clocking has been traditionally used for clock signaling. However, with the push for higher data rates, and particularly higher data rates in high speed serializer-deserializer (SERDES) designs, current-mode logic (CML) clocking is more widely used. That is, it is not power efficient to route clock signals using high rates and or to drive long routes using CMOS clocking circuits. In the CML clock source stage of conventional devices, the current sources and impedances can be programmable to vary the output swing of the clock signal, and can be adjusted for a given data rate for example. However, a conventional CML clock source stage is in open-loop. Therefore, variations, such as process, voltage and temperature (PVT) variations will cause the output amplitude, and therefore the clock signal received at the destination, to vary.

Accordingly, improved circuits for transmitting a signal in a CML circuit would be beneficial.

SUMMARY OF THE INVENTION

A circuit for controlling output swing in a current-mode logic circuit is described. The circuit comprises a plurality of current-mode logic circuits coupled in series; a first current-mode logic circuit of the plurality of current-mode logic circuits coupled to provide a signal to a second current-mode logic circuit of the plurality of current-mode logic circuits; an amplitude detector coupled to detect an amplitude of the signal received at the second current-mode logic circuit; and a control circuit coupled to the amplitude detector; wherein the control circuit generates an amplitude control signal for a current-mode logic circuit of the plurality of current-mode logic circuits based upon a detected amplitude of the signal received at the second current-mode logic circuit.

A method of controlling output swing in a current-mode logic circuit is also described. The method comprises receiving a signal from a first current-mode logic circuit of a plurality of current-mode logic circuits at a second current-mode logic circuit of the plurality of current-mode logic circuits; detecting an amplitude of the signal received at the second current-mode logic circuit; and generating an amplitude control signal for a current-mode logic circuit of the plurality of current-mode logic circuits based upon the detected amplitude of the signal received at the second current-mode logic circuit.

DETAILED DESCRIPTION OF THE DRAWINGS

Figure 1:
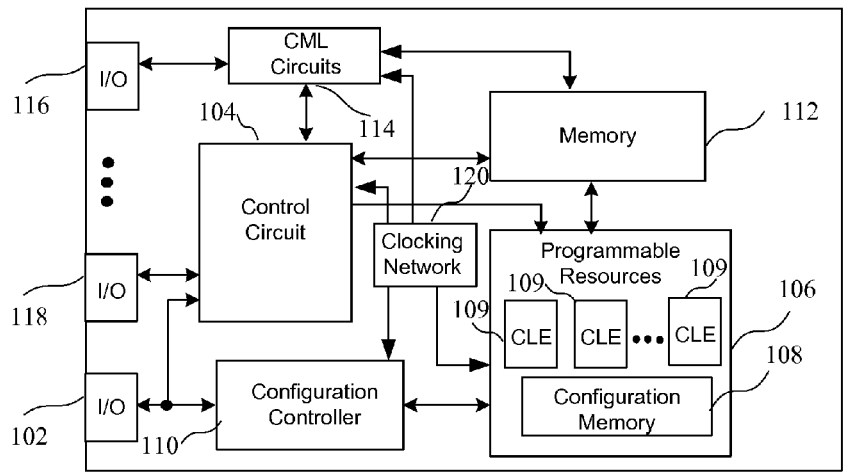
FIG. 1 is block diagram of an integrated circuit device having CML circuits.

While CML clock signaling enables very high-frequency clocking speeds, the power required for CML clock signaling over long routes to the destination can be significant, and the open loop nature of the signaling from the CML clock source can lead to wide variations of input amplitude at the destination CML stage due to process, voltage and temperature (PVT) variations. Swing variation in a signal received at a destination CML stage can affect the operation of the device. For example, the signal swing can be too high or too low. In addition to variations in swing in a clock signal, a CML clocking chain will lead to increased power consumption without controlling swing.

The circuits and methods set forth below enable accurately detecting the amplitude of the CML clock signals at the destination CML stage, and in turn controlling the output swing at the source CML stage, or at a CML circuit or stage after the destination CML stage. As described in more detail below, a CML stage comprises a plurality of CML circuits, where individual CML circuits or the plurality of CML circuits of a CML stage may be controlled by an amplitude control signal. By controlling swing variation at a CML circuit of the destination CML stage, the circuits and methods set forth below advantageously improve the performance as well as lower the total power consumption of the chain of CML circuits.

According to various implementations, the detection of CML swing in a clocking path at the destination CML stage enables a control loop to adjust the output swing of the source CML stage. Similarly, the detection of CML swing at subsequent CML stages could additionally be used in turn to control the output swing of the source CML stage to provide a low-power, low area overhead and minimally invasive solution for calibrating a clock signal. A calibration test procedure for the detector itself can be implemented to remove offset in the path. The improved signal swing at the destination will drive better overall performance of the downstream path, and particularly lead to more controlled overall power consumption of the CML clocking path. While specific references may be made to transmitting clocking signals, it should be understood that the circuits and methods set forth below apply equally to data signals as will be described in more detail below.

For example, a circuit for controlling output swing in a current-mode logic configuration may comprise a first current-mode logic circuit coupled to provide a clock signal to a second current-mode logic circuit. A control circuit may be coupled to an amplitude detector, which detects an amplitude of the clock signal received at the second current-mode logic circuit. The control circuit then generates an amplitude control signal for the first current-mode logic circuit based upon a detected amplitude of the clock signal received at the second current-mode logic circuit. The amplitude control signal provided to the first current-mode logic circuit causes the first current-mode logic circuit to modify parameters for adjusting the output signal swing detected at the second current-mode logic circuit.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Turning first to FIG. 1, a block diagram of integrated circuit device having CML circuits is shown. In particular, an input/output port 102 is coupled to a control circuit 104 that controls programmable resources 106 having configuration memory 108. Configuration data, described in more detail below in reference to FIGS. 14-16, may be provided to the configuration memory 108 by a configuration controller 110. The configuration data enables the operation of configurable elements 109, also described in more detail in reference to FIG. 16. A separate memory 112, which may be a non-volatile memory for example, may be coupled to the control circuit 104 and the programmable resources 106. CML stages 114 may be coupled to the control circuit 104 and the memory 112, and may receive signals external to the integrated circuit device or transmit signals by way of an I/O port 116. Other I/O ports may be coupled to circuits of the integrated circuit device, such as I/O port 118 that is coupled to the control circuit 104 as shown. A clocking network 120 enables routing clock signals through the integrated circuit. The circuits and methods set forth in more detail below may be implemented within a single integrated circuit die, or may be implemented in a multi-chip module as described in FIG. 13 or some other system implementing CML circuits.

Figure 2:
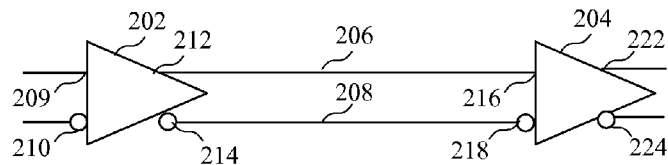
FIG. 2 is a block diagram showing stages of a CML network.

Turning now to FIG. 2, a block diagram shows stages of a CML network. A source CML circuit 202 is coupled to a destination CML stage 204 by way of first and second signal lines 206 and 208. More particularly, differential input signals are received at inputs 209 and 210 and generated at a first output 212 and a second output 214 that are coupled to corresponding inputs 216 and 218 of the destination CML circuit 204, where output signals are generated at outputs 222 and 224.

Figure 3:
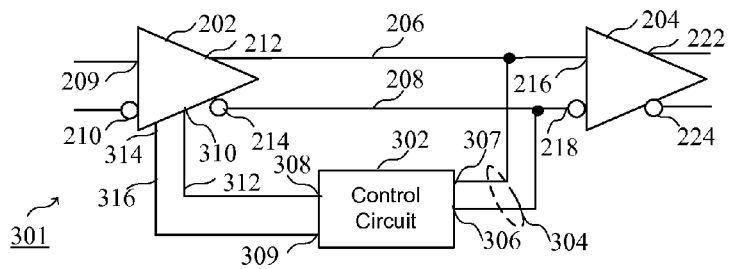
FIG. 3 is a block diagram showing CML stages of a CML network having a control circuit for controlling an amplitude of a signal generated by a source CML stage.

Because a CML clock may be transmitted from the CML source circuit 202 to the CML destination circuit 204 over a lossy route, an amplitude level of the clock signal received at a destination may vary widely for a fixed data-rate over process, voltage and temperature (PVT) variations. When the transmission circuit is implemented in an open-loop arrangement where there is no feedback path to a source CML circuit to adjust a transmitted signal based upon a detected output signal of the CML circuit, swing is not controlled and varies over PVT. However, as shown in the CML stage 301 of FIG. 3, a control circuit 302 may be provided in a feedback path 304 between the inputs 216 and 218 of the destination CML circuit 204 and inputs 310 and 314 of the source CML circuit 202 to configure the source CML circuit 202 to account for such PVT variations. More particularly, the feedback path 304 from the destination circuit 204 is provided to inputs 306 and 307 of the control circuit 302. One or more control signals generated at outputs 308 and 309 of the control circuit 302 is provided to control the source CML circuit 202, such as an amplitude of the signal generated by the source stage, as described in more detail below. A control signal generated at the output 308 is coupled to an input 310 of the CML circuit 202 by a signal line 312, and a control circuit generated at the output 309 is coupled to an input 314 by a signal line 316. As will be described in more detail in reference to FIG. 5, a control circuit of a CML stage, which comprises a plurality of CML circuits, may also be coupled to a CML circuit separate from a CML stage. That is, a plurality of CML circuits may be implemented in a CML stage, where a control circuit may control each CML circuit of the CML stage.

Figure 4:
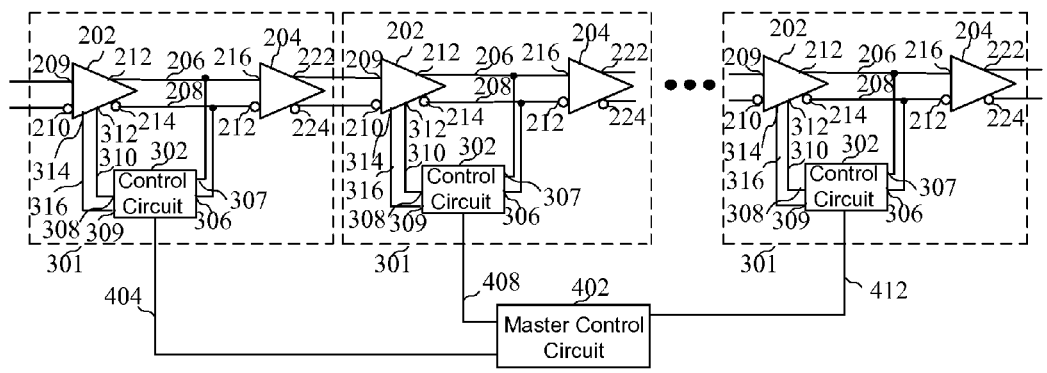
FIG. 4 is a block diagram showing a plurality of CML stages having a master control circuit.
Figure 5:
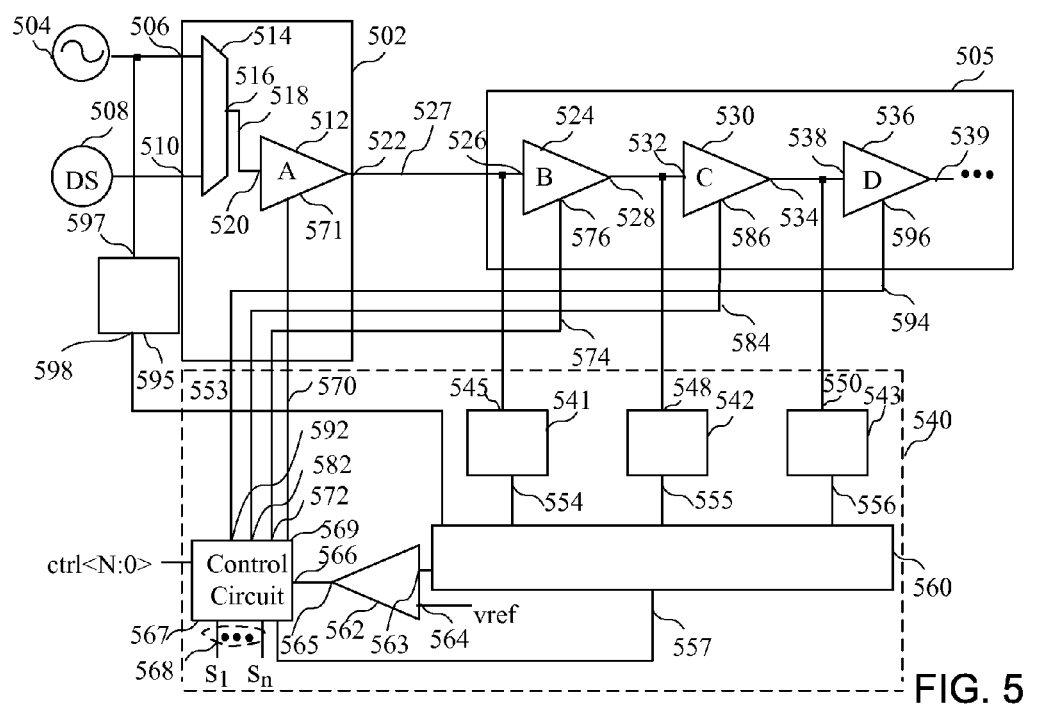
FIG. 5 is a block diagram showing source and destination CML circuits having a control circuit for controlling an amplitude of a signal generated at the source CML circuit based upon a detected signal at a destination CML stage.

FIG. 4 is a block diagram showing a plurality of CML stages having a master control circuit. According to the embodiment of FIG. 4, a plurality of CML stages 301 are coupled together and controlled by a master control circuit 402. More particularly, signals are communicated between the control circuits 302 of the CML stages 301, where a first control signal line 404 is coupled between the master control circuit 402 and the control circuit 302, a second control line 408 is coupled between the master control circuit 402 and the second control circuit 302, a third control line 412 is coupled between the master control circuit and the third control circuit 302. While only two CML circuits 202 and 204 are shown in the CML stages 301, it should be understood that the CML stages 301 of FIGS. 3 and 4 could be implemented as shown in FIG. 5 and described below, where a greater number of CML circuits are implemented. For example, information related to a signal detected at a first CML stage 301 may be provided to a second CML stage, which may be either before or after the first CML stage, to control amplitudes of signals at the second CML stage.

Therefore, in addition to individual control provided by the local control circuits 306, the master control circuit enables having global or coarse control. With the master control circuit, the signal amplitude level of each of the individual CML stages can be sensed. In turn, it is possible to adjust an input amplitude level based on the comparison made of any preceding CML stage, or even the source signal itself. Therefore, while the local control circuits provide feedback to the preceding CML circuit, the master however can provide feedback to any CML stage or even the source CML stage. The master control circuit can use information from the control circuits associated with individual CML stages. For example, the master control circuit can determine the amplitudes of all individual stages, and can use this information to determine the average for each of the CML stages. Based on this average, the master control circuit can then apply an adjustment to the source stage and/or each of the other CML stages. The master control circuit can initially provide global control of all individual CML stages, and thereafter allow the individual control circuits of the CML stages to control each stage. While it may be possible that global control is sufficient for the CML stages, where no further adjustments need to be made by the local control circuits for the CML stages, the local control circuits preferably take over control of the initial global control by the master control circuit.

Turning now to FIG. 5, a block diagram shows source and destination CML circuits having a control circuit for controlling an amplitude of a signal generated at a source CML circuit based upon a detected signal at a destination CML stage. In particular, a source CML stage 502 is coupled to receive a clock signal from a signal generator 504, such as an oscillator circuit, at an input 506. The source CML stage 502 may also receive a second signal from a signal generator 508 at an input 510. The second signal generator 508 may be a data source. A first CML circuit 512 is coupled to receive an output of either the signal generator 504 or the data source 508 by way of inputs 506 and 510, respectively, of the selection circuit 514, shown here as a multiplexer. An output 516 of the selection circuit 514 is coupled to an input 520 of the CML circuit 512 by way of a signal line 518.

The source CML circuit stage 502 is coupled by way of the signal line 527 to a plurality of CML circuits of a destination CML stage 505, at an input 526 of a CML circuit 524. The destination CML stage 505 comprises a plurality of CML circuits coupled in series by signal lines, including the second CML circuit 524 having an input 526 coupled to the signal line 527. An output 528 of the CML circuit 530 is coupled to a third CML circuit 536 at an input 538, where an output signal is generated at an output 539. While three CML circuits of the destination CML stage are shown, it should be understood that the destination CML stage, which may be used for routing a clock signal for example, may have any number of CML circuits. The CML circuits of FIG. 5, also commonly referred to as CML buffers, will be described in more detail in reference to FIG. 7.

A control block 540 provides a feedback path to enable detecting the amplitude of the signal at some node within the signal chain, such as an input to a CML circuit as discussed in more detail below. The control block 540 comprises a plurality of amplitude detectors for detecting an amplitude of a voltage at a particular node. An amplitude detector 541 comprises an input 545 that is coupled to a node at the input 526 of the CML circuit 524, an amplitude detector 542 comprises an input 548 that is coupled to a node at the input 532 of the CML circuit 530, and an amplitude detector 543 comprises an input 550 that is coupled to a node at the input 538 of the CML circuit 536.

A selection circuit 560, which may be a multiplexer for example, selects a signal at an output 554-556 of one of the corresponding amplitude detection circuits 541-543 to be generated at an output 557. The selected signal is coupled to a comparator 562 at a first input 563, wherein the comparator compares the selected detected signal with a reference voltage (vref) received at a second input 564. The reference voltage at the input of the comparator can be chosen to be the desired voltage at the output of each CML stage. The result of the comparison generated at an output 565 of the comparator is coupled to an input 566 of a control circuit 567. The control circuit generates a control signal, which may include an amplitude control signal for example, at an output 569 that is coupled to a corresponding input 571 of the CML circuit 512. Accordingly, feedback is provided to a source CML circuit to enable control of a voltage swing at a destination CML circuit by controlling the source CML circuit 512.

The control circuit receives control signals (ctrl<N:0>) that provide information related to a voltage level of a signal generated by the CML circuit 512. The control signals may be default values that can be modified based upon a detected value received from an amplitude detector or based on a reference signal $s_1$-$s_n$ received at sensor inputs 568. The reference signals $s_1$-$s_n$ may be include information, such as temperature or voltage information. The control circuit generates control signals at the output 569 that are based upon the control signals ctrl<N:0> and a detected signal at an input of a CML circuit generated by the selection circuit 560. For example, if a signal detected at a selected amplitude detector is too small or too large, the control circuit will generate a control signal to increase or decrease the amplitude of the output of the source CML circuit.

The control signals ctrl<N:0> has a default value that is applied for each of the CML stages. The reference signals (s1, s2, . . . sn) coupled to the sensor inputs 568 supply temperature/voltage/process information. The reference signals can be used instead of the default value on the main control signal ctrl<N:0> if desired. Alternatively, the reference signals can be ignored, and the output of the amplitude detectors can simply be polled and measured based upon the default values on the control signal ctrl<N:0>. It should be noted that, even after calibration and sensing of the output signal at each CML stage, if there is an update to one of the reference signals (e.g. the temperature is increased), the new information can be used to update the values on the outputs of the control circuit, or simply maintain the existing values. That is, the reference signals can be used to adjust the outputs of the control circuit (and in turn the control and gain of each CML stage) in combination with the comparator output.

The control circuit 567 also enables controlling destination CML circuits to generate the desired voltage swing at some point beyond a CML circuit that is used to detect a signal. That is, rather than, or in addition to, the control circuit 567 controlling the source CML circuit 512, the control circuit 567 can control the operation of the destination CML circuits 524, 530 and 536. In particular, a first control signal generated at an output 572 may be provided by a signal line 574 to an input 576, a second control signal generated at an output 582 may be provided by a signal line 584 to an input 586, and a third control signal generated at an output 592 may be provided by a signal line 594 to an input 596.

The control circuit 567 controls the selection circuit by way of a selection control line 557. The selection of the particular amplitude detector depends on a desirable location to monitor the signal along the destination CML stage 505. A worst case point for a signal amplitude may exist along the chain of CML circuits, and it would be desirable to adjust the source CML circuit to improve the signal at this point. If this detector is downstream in the chain, not only will the amplitude being adjusted at the selected detector, but the amplitude will also be higher in the proceeding stages. According to one implementation, the control circuit 567 could initially look at all points in the chain to determine a minimum voltage level and make the adjustment based on the minimum voltage level. After this adjustment, the control circuit could generate in the background to simply poll all detectors and check the amplitudes to determine the appropriate adjustment of the source CML circuit, or at another CML circuit, to generate a desired voltage level at a destination CML circuit.

An additional amplitude detector 595 may also be implemented, wherein the signal at an output of the signal generator 504 is coupled to an input 597 of the amplitude detector 595. The amplitude detector 595 generates an output signal at an output 598 coupled to the selection circuit 560. According to an implementation of FIG. 5, the clock source itself can be monitored to detect its signal level. Based upon a detection of its amplitude, a current source of the oscillator can be adjusted to tune the amplitude. The control of the current source at the oscillator would enable a trade off in the phase noise performance of the PLL versus signal amplitude. The control circuits 306 of FIGS. 3 and 4 may implemented according to the circuit of FIG. 5, for example.

Figure 6:
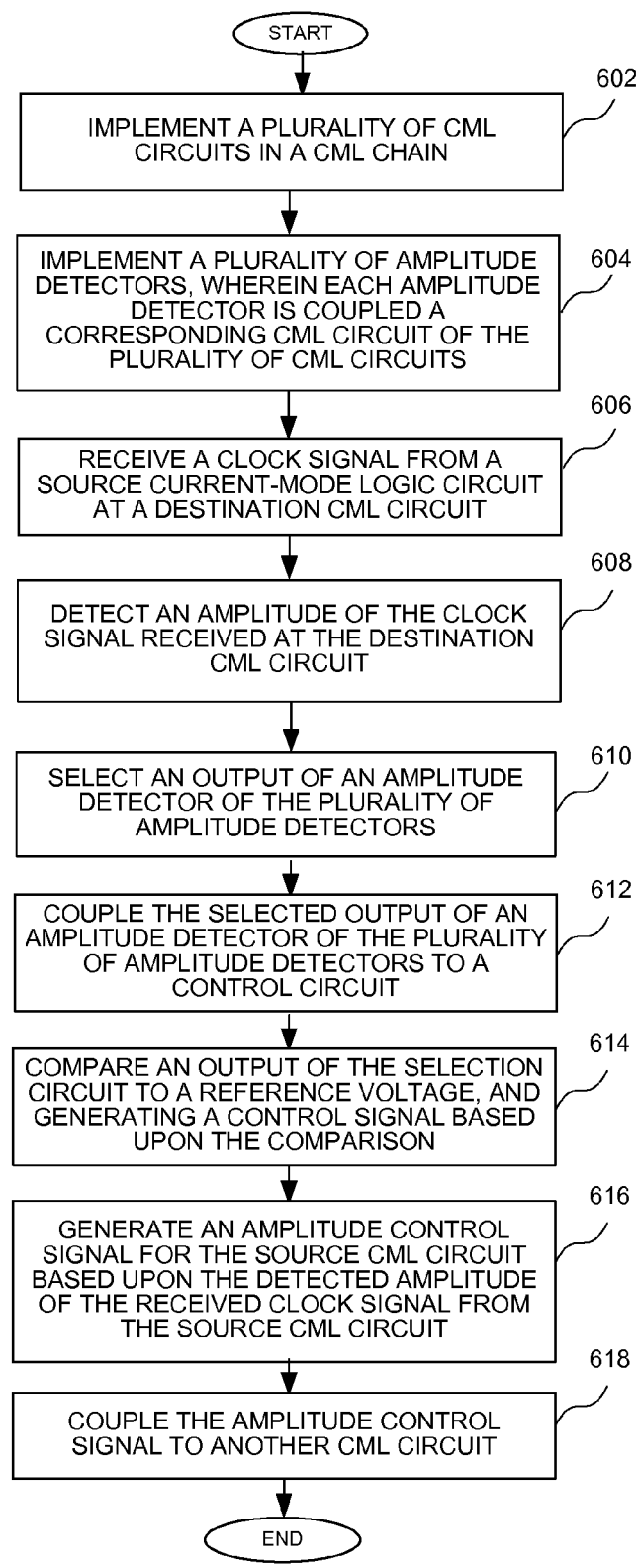
FIG. 6 is a flow chart showing a method of controlling output swing in a current-mode logic circuit.

Turning now to FIG. 6, a flow chart shows a method of controlling output swing in a current-mode logic circuit. In particular, a plurality of CML circuits are implemented in CML chain at a step 602. A plurality of amplitude detectors are implemented, wherein each amplitude detector is coupled a corresponding current-mode logic circuit of the plurality of current-mode logic circuit at a step 604. A clock signal is received from a source CML circuit at a destination CML circuit at a step 606. An amplitude of the clock signal received at the destination CML circuit is detected at a step 608. An output of an amplitude detector of the plurality of amplitude detectors is selected at a step 610. The selected output of an amplitude detector of the plurality of amplitude detectors is coupled to a control circuit at a step 612. An output of the selection circuit is compared to a reference voltage, and a control signal is generated based upon the comparison at a step 614. An amplitude control signal for the source CML circuit is generated based upon the detected amplitude of the received clock signal from the source CML circuit at a step 616. That is, the output of the amplitude detectors can be polled and measured based upon the default values of the control signal ctrl<N:0>. Alternatively, the amplitude control signal may also be based upon the ctrl<N:0> signals and the reference signals $s_1$-$s_n$. For example, the control signals ctrl<N:0> may be applied as a default value that is applied for each of the CML stages. The reference signals (s1, s2, ... sn) can be then used instead of the default value on the main control signal ctrl<N:0>, as described above. The amplitude control signal is then provided to another CML circuit. For example, the amplitude control signal could be provided to the source CML circuit, or another destination CML circuit, as set forth above.

Figure 7:
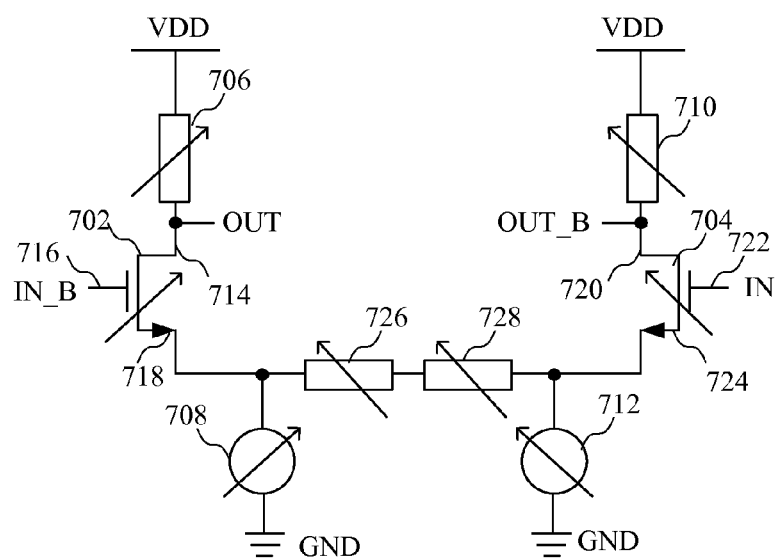
FIG. 7 is a block diagram of a CML circuit that could be implemented in the circuits of FIGS. 1-5.

Turning now to FIG. 7, a block diagram of a CML circuit that could be implemented in the CML circuits of FIGS. 1-5 is shown. The CML circuit receives an input IN_B at a first transistor 702 of a first path and an input IN at a second transistor 704 of a second path. The first path comprises a variable impedance element 706 coupled between a reference voltage VDD and the transistor 702, where variable impedance elements could be implemented as variable resistors, for example. A first current source 708 is also coupled in series with the transistor 702. The second path comprises a variable impedance element 710 coupled between a reference voltage VDD and the transistor 704. A current source 712 is also coupled in series with the transistor 704.

More particularly, a drain 714 of the transistor 702 is coupled to the variable impedance element 706, where the output signal OUT_B is generated in response to an input signal IN coupled to the gate 716 of the transistor 702. A source 718 of the transistor 702 is coupled to the current source 708. Similarly, a drain 720 of the transistor 704 is coupled to the variable impedance element 710, where the output signal OUT is generated in response to an input signal IN_B coupled to the gate 722 of the transistor 704. A source 724 of the transistor 704 is coupled to the current source 712. Swing is programmable via adjusting the programmable load impedance elements 706 and 710 and/or tail current generated by the current sources 708 and 712. Degeneration impedance elements 726 and 728, shown here as variable resistors, may also be implemented to control swing. The values of the impedance elements may be selected by a configuration bitstream downloaded by a user, or controlled by a control circuit during operation of the CML chain. Further, the size of the differential input pair of transistors 702 and 704, such as the gate width, can also be selected to control swing.

Figure 8:
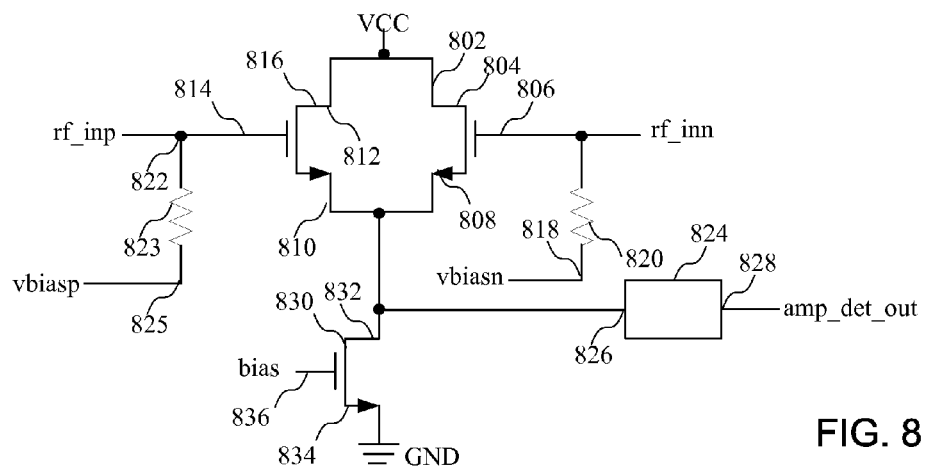
FIG. 8 is a block diagram of a amplitude detector that could be implemented in the circuits of FIGS. 1-5.

Turning now to FIG. 8, a block diagram of an amplitude detector that could be implemented in the circuits of FIGS. 1-5 is shown. The amplitude detector of FIG. 8 comprises a first transistor 802 having a drain 804 coupled to a reference voltage VCC. A gate 806 of the transistor is coupled to receive a first input signal (rf_inn) of a pair of differential input signals. A source 808 of the transistor 802 is coupled to a source 810 of the transistor 812, which is coupled in parallel with transistor 802 as shown. A gate 814 of the transistor 802 is coupled to receive a second input signal rf_inp of the differential pair of signals that can be AC coupled or DC coupled to inputs of the CML circuits. The drain 816 is coupled to the drain 804 of the transistor 802, and the reference voltage VCC. When implemented in the circuits of FIGS. 1-5, the fr_inn and fr_inp are differential signals coupled to the differential input lines at inputs of the CML circuits.

A voltage bias is provided to the gates of each of the transistors, where a first voltage bias (vbiasn) signal is provided to a first terminal 818 of a impedance element 820 having a second terminal 822 coupled to the gate 806 of the transistor 802 and a second voltage bias (vbiasp) is provided to a first terminal 825 of the impedance element 823. The voltage bias signals enable the injection of a reference voltage in order to null an offset voltage through the amplitude detector. A transistor 830 is coupled to the transistors 802 and 812, and has a drain 832 coupled to the sources of the transistors 802 and 812 and a source 834 coupled to a ground (GND) node. A gate 836 is coupled to receive a bias signal (bias). The drain 832 of the transistor is coupled to a filter 824 at an input 826, where an amplitude detector output (amp_det_out) is generated at an output 828.

Figure 9:
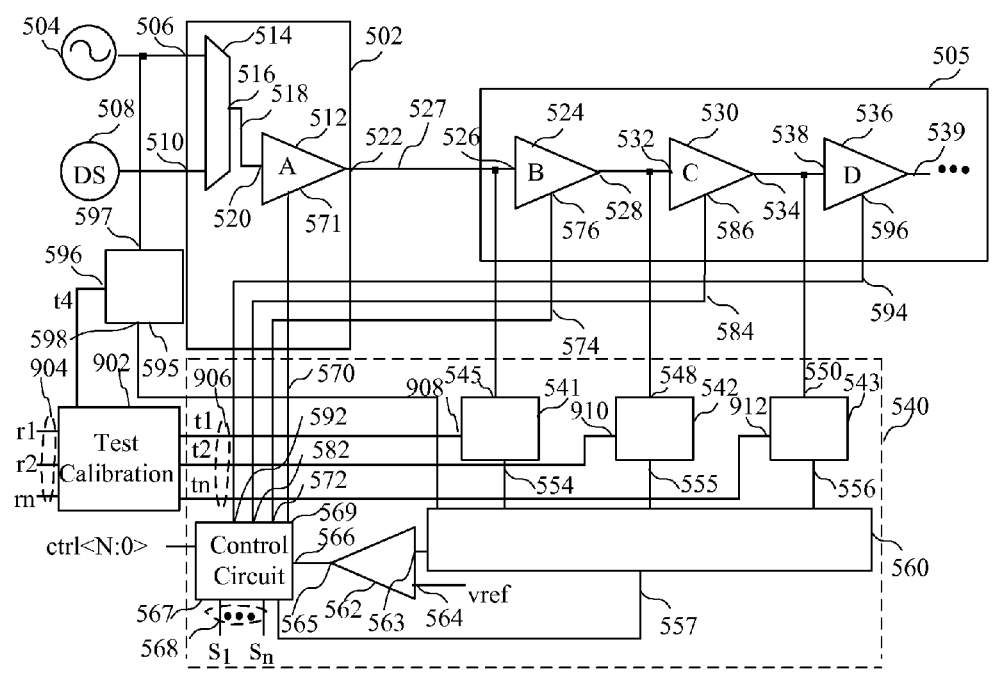
FIG. 9 is a block diagram of another circuit for controlling an amplitude at a CML circuit and having a test calibration circuit.

Turning now to FIG. 9, a block diagram of another circuit for controlling an amplitude at a CML circuit and having a test calibration circuit is shown. A test calibration circuit 902 is coupled to receive test calibration input signals $r_1$-$r_n$ at inputs 904, and generate test calibration control signals $t_1$-$t_n$ at outputs 906 that are coupled to the amplitude detectors. The outputs 906 provide test calibration control signals $t_1$-$t_n$ to corresponding inputs 908, 910 and 912 of the corresponding amplitude detectors 541, 542 and 543. The test calibration input signal $r_1$-$r_n$ may represent different input voltage biases for the detector circuits, while the test signals may comprise a selected reference voltage for controlling the operation of the amplitude detector circuits. That is, while test signals $t_1$-$t_n$ are coupled to the amplitude detectors coupled to corresponding CML circuits, the test signals $t_1$-$t_n$ may be the same values and may be based upon a single reference control signal. It should also be noted that a given test signal may represent multiple bias signals, as described above in reference to the amplitude detector circuit of FIG. 7.

The amplitude detector 541 generates an output signal at the output 554 based upon a test signal $t_1$ received input 908 and a detected voltage at the input 526 of the CML circuit 524 (coupled to the input 545). Similarly, the amplitude detector 542 generates an output signal at an output 555 based upon a test signal $t_2$ received an input 910 and an detected voltage at the input 532 of the CML circuit 530 (coupled to an input 548). Finally, and the amplitude detector 543 generates an output signal at an output 556 based upon a test signal $t_n$ received an input 912 and an detected voltage at the input 538 of the CML circuit 536 (coupled to an input 550). The amplitude detector provides a detected voltage amplitude as an output signal. As will be described in more detail below, the detected voltage amplitude is compared to a reference voltage to determine whether the amplitude of the output signal is at the correct voltage.

The function of the test calibration circuit 902 is to calibrate each of the amplitude detectors. That is, each of the amplitude detectors will have an initial offset. If the amplitude detectors are not calibrated, an error in the measured output voltage will result. The calibration can occur initially, or any time when the circuit is not in a closed loop state.

Figure 10:
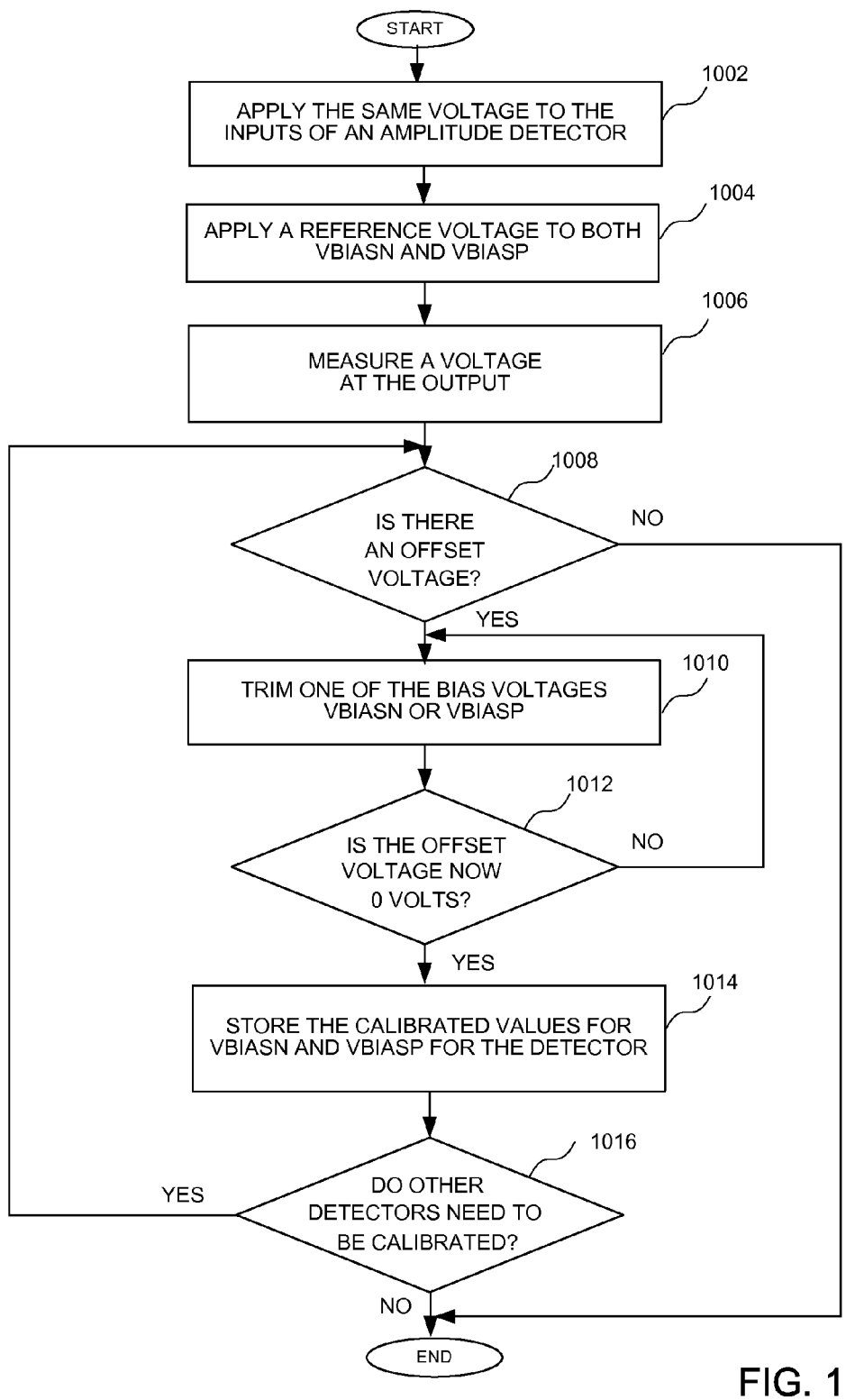
FIG. 10 is a flow chart showing a method of calibrating amplitude detectors used in controlling output swing in a current-mode logic circuit.

FIG. 10 is a flow chart showing a method of calibrating amplitude detectors used in controlling output swing in a current-mode logic circuit. The amplitude detectors can be calibrated during testing of the integrated circuit by applying the same voltage to the inputs of an amplitude detector at a block 1002. For example, the inputs rf_inp and rf_inn of FIG. 8 should be placed at the same voltage. A reference voltage is then connected to both vbiasn and vbiasp at a block 1004. The reference voltage may be one of the control signals r1, r2, ... rn, for example. If the same reference voltage is applied to both vbiasn and vbiasp, the output of the amplitude detector should be 0V (i.e. a zero offset). Accordingly, the offset voltage is then measured at a block 1006, and it is then determined if there is an offset voltage at a block 1008. If it is determined that there is no offset voltage at the block 1008, the amplitude detector is set properly, and no adjustments are needed. If there is an offset, then one of vbiasn or vbiasp is trimmed at a block 1010. For example, if the offset voltage is determined to be negative, vbiasp can be placed at a higher voltage, while keeping vbiasn at its original test value. The output of the amplitude detector is measured again at a block 1012. If the offset voltage is now 0V, then the amplitude detector is calibrated, the calibrated values for vbiasn and vbiasp are stored for the detector at a block 1014. Otherwise the bias voltages are trimmed. It is then determined if there are any other detectors that need to be calibrated. If so, the same sequence can be applied to all detectors, where it is determined if there is an offset voltage at the block 1008.

Figure 11:
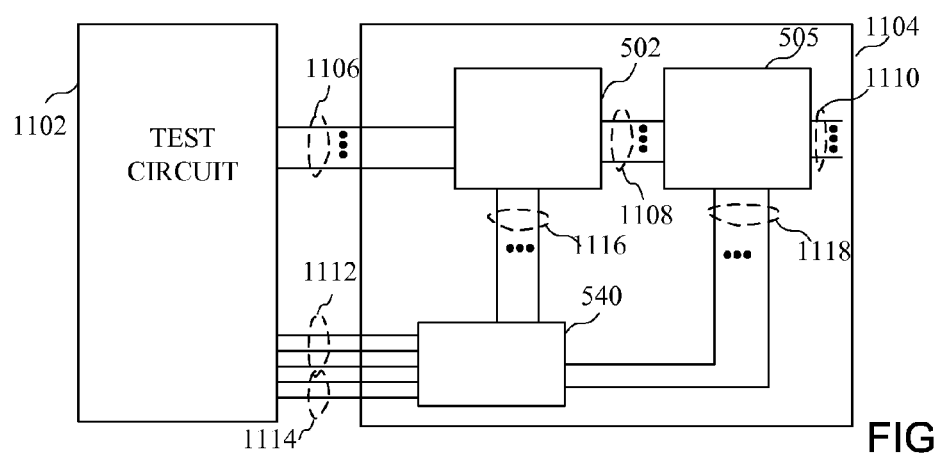
FIG. 11 is a block diagram of a system for testing a circuit having a CML stage.

Turning now to FIG. 11, a block diagram of a system for testing a circuit having a CML stage is shown. In particular, a test circuit 1102 can be coupled to a device 1104 having a CML chain, such as CML circuits of a source CML stage 502 and destination CML stage 505 where test signals may be source CML data 502 using signal lines 1106. Output signals of the source CML stage 502 are coupled to the destination CML circuits by signal lines 1108, and output signals are generated on the signal lines 1110. Test signals, such as test signals $t_1$-$t_n$ generated by the test circuit, can be coupled to the control block 540 using signal lines 1112, while control signals, such as control signal ctrl<N:0>, can be coupled to the control circuit 469 of the control block 540 by signal lines 1114. Voltage values at various nodes of the destination CML circuits can be provided to amplitude detection circuits of the control block 540 by way of signal lines 1116 and 1118. The device 1104 could be an integrated circuit having CML circuits as set forth in FIGS. 1-5, or a system having an integrated circuit having CML circuits, as described below in reference to FIG. 13. Clock or data signals are provided by signal lines 1106, while clock or data signals from the source CML stage 502 are provided to destination CML stage 505 by signal lines 808. While the test circuit 1002 as described above may be implemented in an integrated circuit and used as a part of an internal self-test process, the test circuit 1002 can be implemented in the test circuit 1102.

Figure 12:
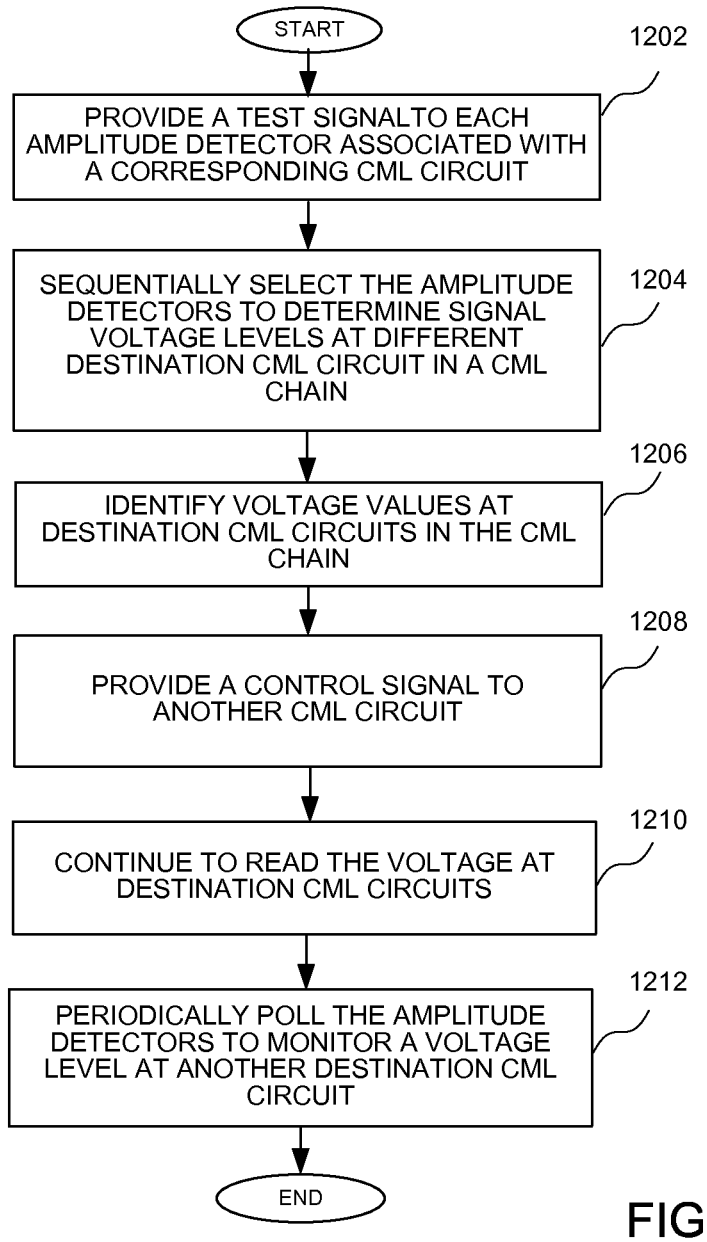
FIG. 12 is a flow chart showing another method of controlling output swing in a current-mode logic circuit.

Turning now to FIG. 12, a flow chart shows another method of controlling output swing in a current-mode logic circuit. In particular, a test signal is provided to each amplitude detector associated with the corresponding CML circuit at a step 1202. The amplitude detectors are sequentially selected to determine signal voltage levels at different destination CML circuit in a CML chain at a step 1204. Voltage values are identified at a destination CML circuit in the CML chain at a step 1206. A control signal is provided to another CML circuit at a step 1208. For example, the amplitude control signal could be provided to the source CML circuit, or another destination CML circuit, as set forth above. If the voltage detected at a destination CML circuit is too low, the source and the destination CML circuit may be adjusted. If the voltage detected at the destination CML circuit is too high, the source CML circuit and a previous CML circuit may be adjusted. The voltage at all destination CML circuits, or a destination CML circuit of particular significance, such as a CML circuit having the low or high voltage value, is continuously read at a step 1210. The amplitude detectors are periodically polled to monitor a voltage level at another destination CML circuit at a step 1212.

The various elements of the methods of FIGS. 6, 10 and 12 may be implemented using the circuits of FIGS. 1-5, 7-9 and 13-16 as described, or using some other suitable circuits. While specific elements of the method are described, it should be understood that additional elements of the method, or additional details related to the elements, could be implemented according to the disclosure of FIGS. 1-5, 7-9 and 13-16.

Figure 13:
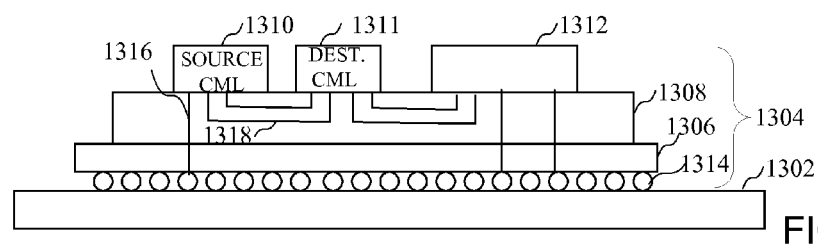
FIG. 13 is a block diagram of a multichip module having CML circuits.

Turning now to FIG. 13, a block diagram of a multichip module having a CML stage is shown. According to the embodiment of FIG. 13, a circuit board 1302, such as a printed circuit board, is configured to receive a multi-die integrated circuit 1304. The multi-die integrated circuit 1304 comprises a substrate 1306 coupled to receive an interposer circuit 1308. The interposer circuit 1308 enables coupling multiple integrated circuit chips or die, such as a chip 1310 having a source CML circuit and a chip 1311 having a destination CML circuit, and another chip 1312, to the substrate 1306. The source and destination CML circuits of the chips 1310 and 1311 can communicate as described above in reference to FIGS. 1-5, for example. Solder balls 1314 enabling enable coupling signals from the various chips to the circuit board 1302 by way of various interconnects 1316, such as through silicon vias (TSVs). Interconnects 1318 also enable the routing of signals between the various chips of the multi-die integrated circuit. The interposer circuit 1308 may be a silicon substrate with various metal layers comprising interconnect elements enabling the routing of signals between the FPGA chips and the data converter chip or between one of the chips and the substrate 1306. However, the interposer circuit could be any material having conductive elements that enable routing signals as shown. While all of FIG. 13 could be implemented on a single die, the embodiment of FIG. 13 enables more efficiently implementing the various circuits of FPGA chips 1310. For example, some circuits may be more efficiently implemented in an integrated circuit chip manufactured according to one process, such as a process forming transistors of a certain dimension, while other circuits may be implemented more efficiently in an integrated circuit chip manufactured according to another process.

Figure 14:
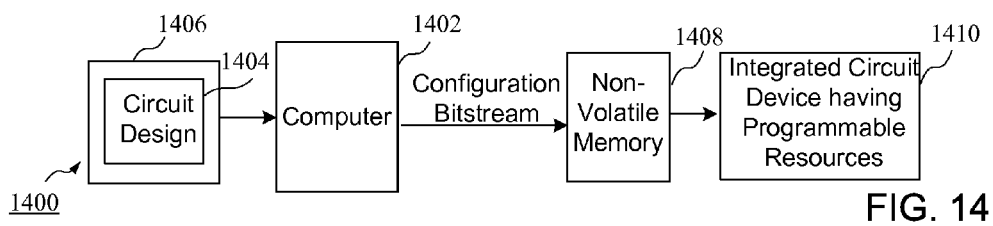
FIG. 14 is a block diagram of a system for programming a device having programmable resources.

Circuits for controlling output swings in a current-mode logic circuit configuration may be implemented using various integrated circuit designs, including devices having programmable resources. Turning now to FIG. 14 a block diagram of a system for programming a device having programmable resources according to an embodiment is shown. In particular, a computer 1402 is coupled to receive a circuit design 1404 from a memory 1406, and generates a configuration bitstream that is stored in the non-volatile memory 1406. As will be described in more detail below, the circuit design may be a high level design, such as a circuit design defined in a hardware description language (HDL). Also, the computer may be configured to run software that generates a configuration bitstream that is stored in the non-volatile memory 1408 and provided to an integrated circuit 1410 that may be a programmable integrated circuit, such as the integrated circuit described below in FIG. 15. As will be described in more detail below, bit of the configuration bitstream are used to configure programmable resources of the integrated circuit.

Figure 15:
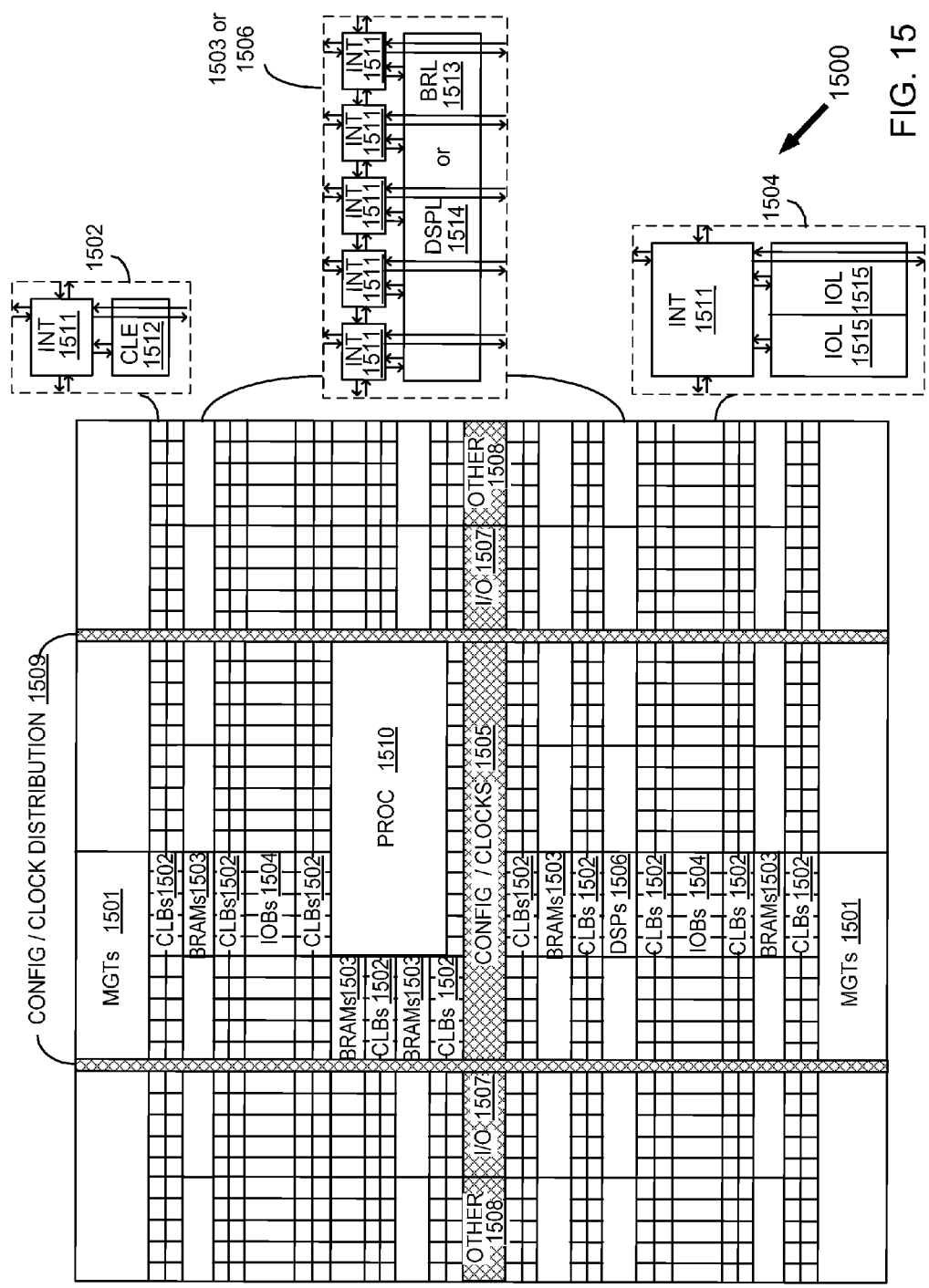
FIG. 15 is a block diagram of a device having programmable resources.

Turning now to FIG. 15, a block diagram of a device having programmable resources including the circuits of FIGS. 1-5 and 7-9 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 15 comprises an FPGA architecture 1500 having a large number of different programmable tiles including multi-gigabit transceivers (MGTs) 1501, CLBs 1502, random access memory blocks (BRAMs) 1503, input/output blocks (IOBs) 1504, configuration and clocking logic (CONFIG/CLOCKS) 1505, digital signal processing blocks (DSPs) 1506, specialized input/output blocks (I/O) 1507 (e.g., configuration ports and clock ports), and other programmable logic 1508 such as digital clock managers, analog-to-digital converters, system monitoring logic, and so forth. Some FPGAs also include dedicated processor blocks (PROC) 1510, which may be used to implement a software application, for example.

In some FPGAs, each programmable tile includes a programmable interconnect element (INT) 1511 having standardized connections to and from a corresponding interconnect element in each adjacent tile. Therefore, the programmable interconnect elements taken together implement the programmable interconnect structure for the illustrated FPGA. The programmable interconnect element 1511 also includes the connections to and from the programmable logic element within the same tile, as shown by the examples included at the top of FIG. 15.

For example, a CLB 1502 may include a configurable logic element (CLE) 1512 that may be programmed to implement user logic plus a single programmable interconnect element 1511. A BRAM 1503 may include a BRAM logic element (BRL) 1513 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 1506 may include a DSP logic element (DSPL) 1514 in addition to an appropriate number of programmable interconnect elements. An 10B 1504 may include, for example, two instances of an input/output logic element (IOL) 1515 in addition to one instance of the programmable interconnect element 1511. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. The config/clock distribution regions 1509 extending from this column are used to distribute the clocks and configuration signals across the breadth of the FPGA. Some FPGAs utilizing the architecture illustrated in FIG. 15 include additional logic blocks that disrupt the regular columnar structure making up a large part of the FPGA. The additional logic blocks may be programmable blocks and/or dedicated logic. For example, the processor block PROC 1510 shown in FIG. 15 spans several columns of CLBs and BRAMs.

Note that FIG. 15 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 15 are purely exemplary. For example, in an actual FPGA more than one adjacent column of CLBs is typically included wherever the CLBs appear in order to facilitate the efficient implementation of user logic. While the embodiment of FIG. 15 relates to an integrated circuit having programmable resources, it should be understood that the circuits and methods set forth in more detail below could be implemented in any type of ASIC.

Figure 16:
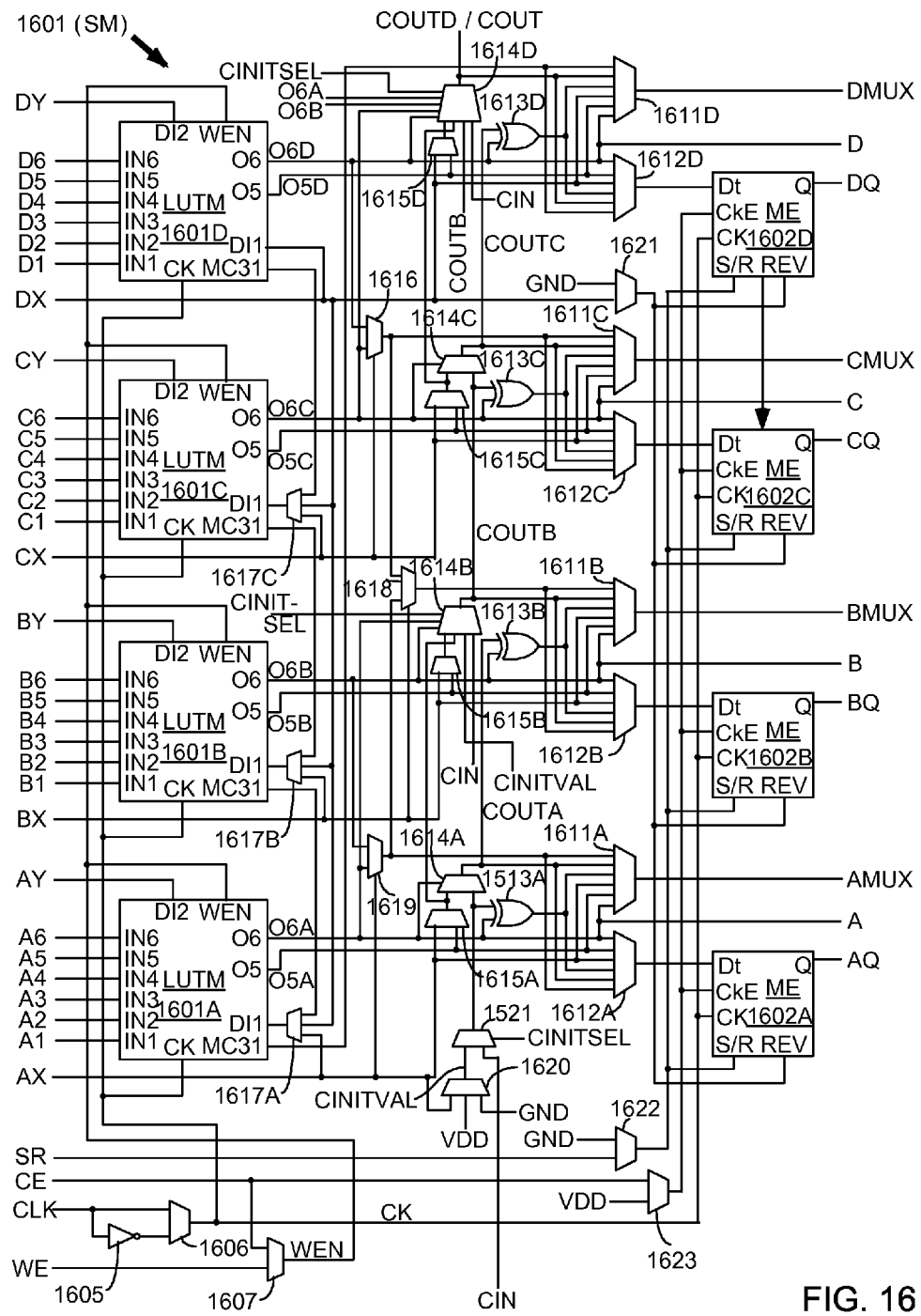
FIG. 16 is a block diagram of a configurable logic element of the device of FIG. 15.

Turning now to FIG. 16, block diagram of a configurable logic element of the device of FIG. 15 is shown. In particular, FIG. 16 illustrates in simplified form a configurable logic element of a configuration logic block 1502 of FIG. 15. In the embodiment of FIG. 16, slice M 1601 includes four lookup tables (LUTMs) 1601A-1601D, each driven by six LUT data input terminals A1-A6, B1-B6, C1-C6, and D1-D6 and each providing two LUT output signals O5 and O6. The O6 output terminals from LUTs 1601A-1601D drive slice output terminals A-D, respectively. The LUT data input signals are supplied by the FPGA interconnect structure via input multiplexers, which may be implemented by programmable interconnect element 1611, and the LUT output signals are also supplied to the interconnect structure. Slice M also includes: output select multiplexers 1611A-1611D driving output terminals AMUX-DMUX; multiplexers 1612A-1612D driving the data input terminals of memory elements 1602A-1602D; combinational multiplexers 1616, 1618, and 1619; bounce multiplexer circuits 1622-6; a circuit represented by inverter 1605 and multiplexer 1606 (which together provide an optional inversion on the input clock path); and carry logic having multiplexers 1614A-1614D, 1615A-1615D, 1620-1621 and exclusive OR gates 1613A-1613D. All of these elements are coupled together as shown in FIG. 16. Where select inputs are not shown for the multiplexers illustrated in FIG. 16, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 16 for clarity, as well as from other selected figures herein.

In the pictured embodiment, each memory element 1602A-1602D may be programmed to function as a synchronous or asynchronous flip-flop or latch. The selection between synchronous and asynchronous functionality is made for all four memory elements in a slice by programming Sync/Asynch selection circuit 1603. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1602A-1602D are clocked by a clock signal CK, which may be provided by a global clock network or by the interconnect structure, for example. Such programmable memory elements are well known in the art of FPGA design. Each memory element 1602A-1602D provides a registered output signal AQ-DQ to the interconnect structure. Because each LUT 1601A-1601D provides two output signals, O5 and O6, the LUT may be configured to function as two 5-input LUTs with five shared input signals (IN1-IN5), or as one 6-input LUT having input signals IN1-IN6.

In the embodiment of FIG. 16, each LUTM 1601A-1601D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1617A-1617C for LUTs 1601A-1601C), or to the two 32-bit RAMs via input terminals DI1 and DI2. RAM write operations in the LUT RAMs are controlled by clock signal CK from multiplexer 1506 and by write enable signal WEN from multiplexer 1607, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1601A may also be provided to the general interconnect structure for shift register chaining, via output select multiplexer 1511D and CLE output terminal DMUX. Accordingly, the circuits and methods set forth above may be implemented in a device such as the devices of FIGS. 15 and 16, or any other suitable device.

It can therefore be appreciated that new circuits for and methods of controlling output swing in a current-mode logic circuit has been described. It will be appreciated by those skilled in the art that numerous alternatives and equivalents will be seen to exist that incorporate the disclosed invention. As a result, the invention is not to be limited by the foregoing embodiments, but only by the following claims.

We claim:

1. A circuit for controlling output swing in a current-mode logic circuit, the circuit comprising:
   a plurality of current-mode logic circuits coupled in series;
   a first current-mode logic circuit of the plurality of current-mode logic circuits coupled to provide a signal to a second current-mode logic circuit of the plurality of current-mode logic circuits;
   a plurality of amplitude detectors, wherein each amplitude detector is coupled to a corresponding current-mode logic circuit of the plurality of current-mode logic circuits;
   a selection circuit coupled to outputs of the plurality of amplitude detectors, wherein an output of an amplitude detector of the plurality of amplitude detectors is selected; and
   a control circuit coupled to the selection circuit to receive the selected output, wherein the control circuit generates an amplitude control signal for controlling an output swing of a current-mode logic circuit of the plurality of current-mode logic circuits based upon the detected amplitude of the selected output.

2. The circuit of claim 1 wherein the signal comprises a clock signal.

3. The circuit of claim 1 wherein an amplitude detector of the plurality of detectors is coupled to an input of the second current mode logic circuit and is configured to detect an amplitude of the signal received at the second current mode logic circuit, and the amplitude control signal is coupled to control the second current-mode logic circuit.

4. The circuit of claim 1, wherein the amplitude control signal is coupled to a third current-mode logic circuit of the plurality of current-mode logic circuits and configured to control the third current-mode logic circuit.

5. The circuit of claim 1 further comprising a comparator having a first input coupled to an output of the selection circuit and a second input coupled to a reference voltage, wherein the comparator generates a control signal coupled to the control circuit.

6. The circuit of claim 1, wherein each current-mode logic circuit coupled to a corresponding amplitude detector is a current-mode logic circuit of a current-mode logic stage.

7. The circuit of claim 6 further comprising a second control circuit coupled to a second plurality of amplitude detectors.

8. The circuit of claim 7 further comprising a master control circuit coupled to the control circuit and the second control circuit, wherein the master control circuit communicates information between the control circuit and the second control circuit.

9. The circuit of claim 6 wherein the control circuit is coupled to receive a control signal comprising a default value, and the amplitude control signal is applied to each current-mode logic circuit of the current-mode logic stage and is based upon the default value.

10. The circuit of claim 9 wherein the control circuit is coupled to receive a reference signal, and the amplitude control signal is applied to each current-mode logic circuit of the current-mode logic stage and is based upon the default value and the reference signal.

11. The circuit of claim 6 further comprising a test calibration circuit having a first set of outputs coupled to the plurality of amplitude detectors, wherein the test calibration circuit receives test calibration input signals at a first plurality of inputs, and generates test calibration control signals at the first plurality of outputs.

12. The circuit of claim 1 wherein the first current-mode logic circuit is coupled to a signal generator, the circuit further comprising a second amplitude detector coupled to an output of the signal generator.

13. A method of controlling output swing in a current-mode logic circuit, the method comprising:
receiving a signal from a first current-mode logic circuit of a plurality of current-mode logic circuits at a second current-mode logic circuit of the plurality of current-mode logic circuits;
implementing a plurality of amplitude detectors, wherein each amplitude detector is coupled to a corresponding current-mode logic circuit of the plurality of current-mode logic circuits;
selecting, by a selection circuit, an output of an amplitude detector of the plurality of amplitude detectors;
coupling the selected output of the amplitude detector of the plurality of amplitude detectors to a control circuit; and
generating an amplitude control signal for a current-mode logic circuit of the plurality of current-mode logic circuits, wherein generating the amplitude control signal is in response to the selected output of the amplitude detector.

14. The method of claim 13 further comprising coupling the amplitude control signal to the first current-mode logic circuit.

15. The method of claim 13 further comprising comparing the selected output to a reference voltage, the control circuit generating a control signal based upon the comparison.

16. The method of claim 13 further comprising coupling the amplitude control signal to a third current-mode logic circuit.

17. The method of claim 13 further comprising implementing a comparator having a first input coupled to an output of the selection circuit and a second input coupled to a reference voltage, wherein the comparator generates a control signal coupled to the control circuit.

18. The method of claim 13, wherein each current-mode logic circuit coupled to a corresponding amplitude detector is a current-mode logic circuit of a current-mode logic stage.

19. The method of claim 18 further comprising a second control circuit coupled to a second plurality of amplitude detectors.

20. The method of claim 19 further comprising implementing a master control circuit coupled to the control circuit and the second control circuit, wherein the master control circuit communicates information between the control circuit and the second control circuit.

* * * * *